United States Patent
Hayashi et al.

[11] Patent Number: 5,674,366
[45] Date of Patent: Oct. 7, 1997

[54] METHOD AND APPARATUS FOR FABRICATION OF DIELECTRIC THIN FILM

[75] Inventors: Shigenori Hayashi, Nara; Kazuki Komaki, Osaka; Takeshi Kamada, Osaka; Masatoshi Kitagawa, Osaka; Takashi Deguchi, Shiga; Ryoichi Takayama; Takashi Hirao, both of Osaka, all of Japan

[73] Assignee: Matsushita Electric Industrial Co., Ltd., Osaka, Japan

[21] Appl. No.: 483,873

[22] Filed: Jun. 7, 1995

Related U.S. Application Data

[62] Division of Ser. No. 159,522, Dec. 1, 1993, abandoned.

[30] Foreign Application Priority Data

| Dec. 1, 1992 | [JP] | Japan | 4-321570 |
| Dec. 1, 1992 | [JP] | Japan | 4-321572 |
| Dec. 1, 1992 | [JP] | Japan | 4-321573 |
| Dec. 10, 1992 | [JP] | Japan | 4-330270 |

[51] Int. Cl.⁶ .................................. C23C 14/34
[52] U.S. Cl. ............... 204/298.09; 204/298.03; 204/298.15; 204/298.23; 204/298.26; 204/298.28; 204/192.22
[58] Field of Search ............ 204/298.03, 298.09, 204/298.15, 298.23, 298.26, 298.28, 192.22, 192.12, 192.2; 118/719, 723 R, 723 VE, 723 MP, 723 ME, 723 E, 723 I, 724, 725, 729, 730

[56] References Cited

U.S. PATENT DOCUMENTS

| 4,392,931 | 7/1983 | Maniv et al. | 204/192.12 |
| 4,492,620 | 1/1985 | Matsuo et al. | 204/192.12 |
| 4,793,908 | 12/1988 | Scott et al. | 204/192.26 |
| 4,842,704 | 6/1989 | Collins et al. | 204/192.24 |
| 4,851,095 | 7/1989 | Scobey et al. | 204/192.12 |
| 4,888,246 | 12/1989 | Kuwata et al. | 204/192.22 |
| 4,911,809 | 3/1990 | Wort et al. | 204/298.26 |
| 5,016,563 | 5/1991 | Murakami et al. | 118/725 |
| 5,154,810 | 10/1992 | Kamerling et al. | 118/719 |
| 5,198,090 | 3/1993 | Galicki et al. | 204/298.11 |
| 5,292,417 | 3/1994 | Kugler | 204/298.03 |
| 5,332,482 | 7/1994 | Sameshima | 204/192.11 |

FOREIGN PATENT DOCUMENTS

| 2-210867 | 8/1990 | Japan . |

*Primary Examiner*—R. Bruce Breneman
*Assistant Examiner*—Rodney G. McDonald
*Attorney, Agent, or Firm*—McDermott, Will & Emery

[57] ABSTRACT

A method whereby perovskite type oxide dielectric thin films with $ABO_3$ structure are able to be formed with such features as good stability, uniformity, reproducibility, or the like, with high through-put by having a deposition process, wherein the thin films are deposited on a substrate, and a stabilization process, where no deposition of the thin films takes place, repeated alternatingly while the substrate temperature being kept near the temperature at which perovskite type oxide dielectric thin films are formed. Also, by employing (i) a processing method wherein a decomposing excitation of a reactive gas due to plasma takes place on or near the deposition surface in a gaseous atmosphere comprising a gas that reacts with the elements composing the thin films, (ii) a processing method wherein an oxidation reaction takes place on the deposition surface in a gaseous atmosphere comprising at least ozone ($O_3$), and (iii) a processing method wherein light of short wave length is irradiated on the deposition surface in a gaseous atmosphere comprising at least reactive elements in the non-deposition process, the oxygen concentration in the deposited thin films is adjusted and dielectric thin films of good quality and an extremely low defect content are realized.

12 Claims, 9 Drawing Sheets

METHOD AND APPARATUS FOR FABRICATION OF DIELECTRIC THIN FILM

This is a divisional of application of U.S. application Ser. No. 08/159,522, filed Dec. 1, 1993 now abandoned in favor of continuing U.S. application Ser. No. 08/483,835.

BACKGROUND OF THE INVENTION

The present invention relates to electronic functional thin films, and more particularly relates to a method and apparatus for fabricating oxide dielectric thin films or the like.

In recent years, a dielectric material having a perovskite structure, which has the composition of $ABO_3$, has been attracting special interest as a thin film material where, "A" (or site A) comprises at least one element selected from the group comprising lead (Pb), barium (Ba), strontium (Sr) and lanthanum (La), and "B" (or site B) comprises at least one element selected from the group consisting of titanium (Ti) and zirconium(r), respectively.

The ferroelectric material represented by $(Pb_{1-x}La_x)(Zr_yTi_{1-y})_{1-x/4}O_3$ system or $BaTiO_3$ system excels in having properties of ferro-electricity, piezoelectricity, pyroelectricity, electrooptical effect, or the like. For these reasons, a variety of functional devices utilizing the ferroelectric material have been under study. For example, an application of ferroelectric materials in new "non-volatile memory" devices has been sought after with great expectations in the area of semiconductor integrated circuits or "ICs".

Although dielectric materials having a perovskite structure, such as $SrTiO_3$, do not show the properties of ferroelectricity, they are expected to be applied in a capacitor insulating film for a super-high density DRAM as a material of high dielectric coefficient. In order to improve the dielectric coefficient characteristics of these materials, or enhance the extent of integration of these materials into DRAMs or the like, it is very important to make thin films of these materials.

When it comes to realization of a high performance with these materials, it is desirable to have them processed to take the form of a single crystal film or an orientation film. In this regard, it is important to develop a hetero-epitaxial growth technology. The studies on the foregoing have been carried out at many research institutions utilizing various thin film deposition methods.

For example, an attempt to enhance the quality of thin films through employing a non-deposition process intermittently have been made on an experimental base, but it was mostly relying on controlling a shutter or a deposition source, with resultant poor through-put and also concern over a disturbance in the deposition source. While it can also be said that studies on certain particular material systems have already been completed, they are limited to the experimental stage.

However, generally, it has been difficult to produce thin films of required characteristics and good reproducibility by controlling composition, crystalline structure or the like at the stage of a practical and mass-producible process. The crystallinity of thin films is basically controlled by substrate materials, chemical compositions, and deposition temperatures. In general, when lattice mismatching with substrates is minimized and deposition methods of enhanced activation are employed to realize matching in chemical compositions, crystalline thin films will be gained at the crystallization temperature.

According to the sputtering method which has been generally used in making thin films of oxide dielectric substance, a high substrate temperature of around 600° C. and an oxidizing atmosphere are needed to get crystalline thin films. However, the differences in chemical composition between sintered oxide bodies serving as target materials and deposited thin films are likely to be created. Further, depending on the subtle differences in sputtering conditions, marked adverse effects will be observed in compositions, such as crystallinity, morphology or the like.

These adverse effects have been constitute substantial obstacles in providing a method and apparatus for mass-production of thin films wherein uniformity and reproducibility are important. Particularly, although an increased deposition speed desirably contributes to enhancing the through-put in mass-production, the thin films deposited at a high speed under a thermally non-equilibrium condition have tended to cause such problems as excessively small crystal grains, inferior morphology, lack of stability, or the like.

None of the prior art methods and apparatus achieve the advantages of mass-producing thin films in a manner to establish mass-producibility, stability, uniformity, and reproducibility thereof which overcome the problems of excessively small crystal gains, inferior morphology, lack of stability, or the like. The present inventive method and apparatus provides great advantages which satisfy both the stability and mass-producibility which is realized through having a plurality of substrates passed over a deposition source periodically and through a plurality of steps of [high speed deposition]—[stabilization]—[high speed deposition]—[stabilization]; repeated alternatingly.

Accordingly, the present invention provides a method and apparatus for mass-producing perovskite type oxide dielectric thin films with high through-put, and good stability, uniformity, and reproducibility. Thus, according to the present invention, an apparatus and process for fabricating thin films of oxide dielectric substances having extremely small numbers of defects have been made available for the extremely great benefit of the industry. The dielectric substances to be used are multi-element oxides, characteristics of which can be greatly influenced not only by the chemical composition and crystallinity but also by the morphology thereof. Importantly, the present invention certainly contributes to realization of very high precision thin films using these dielectric substances.

SUMMARY OF THE INVENTION

According to the present invention, a method for fabrication of dielectric thin films formed of $ABO_3$ perovskite type composite compounds, which are composed of the site A comprising at least one element from lead, barium, strontium and lanthanum, the site B comprising at least one element from titanium and zirconium, and oxygen, the method comprising the steps of having a deposition process where thin films are deposited on a substrate; and having a stabilization process to stabilize crystal grains of the thin films, wherein deposition of the thin films and stabilization thereof is performed while the temperature of the substrate is kept at a specified temperature suitable to form $ABO_3$ perovskite type composite compounds.

Preferably, the stabilization process includes either a non-deposition process or a low-speed deposition process having a speed of deposition less than the speed of the deposition process whereby thin films are being stabilized during the stabilization process.

In another embodiment of the invention, an apparatus for fabrication of dielectric thin films formed of $ABO_3$ perovskite type composite compounds, which are composed of the site A comprising at least one element from lead, barium, strontium and lanthanum, the site B comprising at least one element from titanium and zirconium, and oxygen, the apparatus comprising a means to keep the substrate temperature to a temperature at which perovskite type crystalline thin films are obtainable; and a mechanism having means for depositing thin films on the substrate, and means to stabilize crystal grains of the thin films.

Preferably, the apparatus for fabrication of dielectric thin films includes means for depositing thin films comprises a sputtering device, and further comprises a means to have the substrate passed over targets periodically and also a means to control the means for depositing thin films on the substrate, and means to stabilize crystal grains of the thin films to be repeated periodically.

In another embodiment, an apparatus for fabricating dielectric thin films formed of $ABO_3$ perovskite type composite compounds composed of a site A having at least one element selected from the group consisting of lead, barium, strontium and lanthanum, a site B having at least one element selected from the group consisting of titanium and zirconium, and oxygen, the apparatus comprising a heater suitable to keep the substrate temperature at a temperature at which perovskite type crystalline thin films are obtained; and a mechanism having a device for depositing thin films on the substrate, and a device to stabilize crystal grains of the thin films.

In another embodiment, a method for fabrication of dielectric thin films comprises the steps of providing a sputtering chamber suitable for thin film deposition of a ferroelectric target onto a substrate as the substrate is passed over the target periodically; placing the ferroelectric target into the sputtering chamber in a manner allowing the ferroelectric target to be periodically passed over the substrate while maintaining the temperature of the substrate at a specified temperature suitable to form high crystallinity films of perovskite structure, the chamber defining a mixed atmosphere suitable to form high crystallinity films of perovskite structure; the ferroelectric target selected from the $group_{AB}$ where A is selected from the group consisting of at least one element from lead, barium, strontium and lanthanum, B is selected from the group consisting of at least one element from titanium and zirconium; depositing thin films by on a substrate followed by a non-depositing step wherein no deposition of thin films is performed, the depositing step and non-depositing step repeated alternatingly, while the temperature of the substrate is kept at the specified temperature in the mixed atmosphere wherein the thin films formed on the substrate are defined to $comprise_{ABO3}$ perovskite type composite compounds.

As pointed out in greater detail below, the method and apparatus of producing thin films provides important advantages over the prior art thin film methods and apparatus. Specifically, in order to achieve the foregoing advantages, the method and apparatus for producing thin films as disclosed above by the present invention stabilizes deposited thin films in steps for enhancement of the quality of the dielectric thin films by an intermittent introduction of a non-deposition step while the substrate temperature is kept at around the deposition temperature of the perovskite type dielectric thin films at the time of the deposition performed under the condition of a high deposition speed.

Particularly, as the specific means to achieve the foregoing, a plurality of substrates are prepared in advance and the respective substrates are passed over the source of deposition periodically to complete a periodically repeating process of [deposition]—[stabilization]—[deposition]—[stabilization] and so on in order to realize a process which excels in through-put. In another embodiment, substrates are passed over the source of deposition repeating the process of [high speed deposition]—[stabilization]—[high speed deposition]—[stabilization] in a repetitive cycle.

In addition, the present invention provides the advantages of controlling the concentration of oxygen contained in the thin films and realize thin films of good quality showing an extremely small number of defects at a low substrate temperature in the non-deposition process. This is achieved by: (i) causing a decomposition excitation of reactive gases due to plasma to take place on or near the deposition surface in a gaseous atmosphere comprising a gas which reacts with the elements to compose the thin films; or (ii) causing an oxidation reaction to take place on the deposition surface in a gaseous atmosphere comprising at least ozone ($O_3$); or (iii) irradiating light of short wave length on the deposition surface in a gaseous atmosphere comprising at least reactive elements.

The invention itself, together with further objects and attendant advantages, will best be understood by reference to the following detailed description, taken in conjunction with the accompanying drawings.

DETAILED DESCRIPTION OF THE INVENTION

Figure 1:
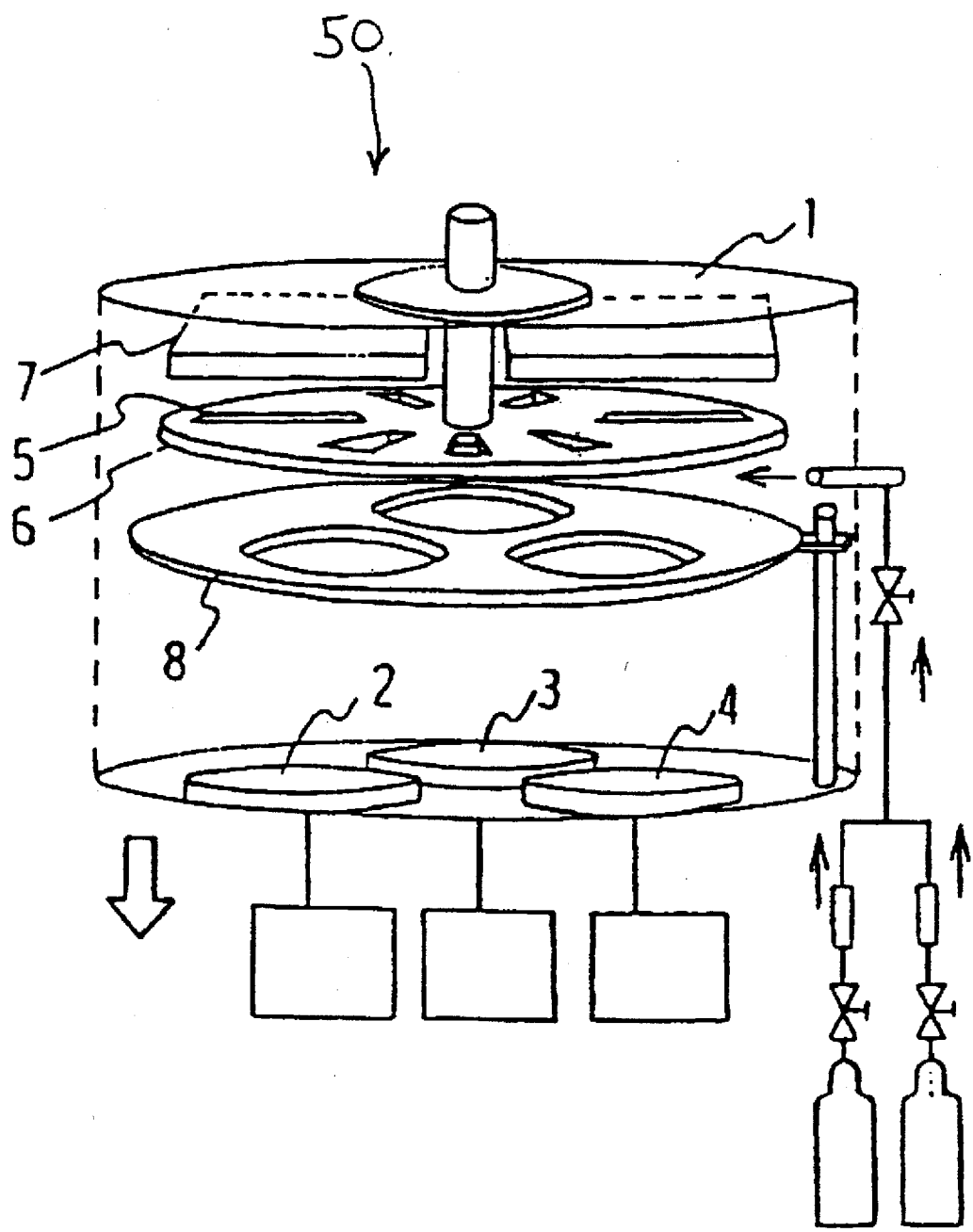
FIG. 1 is a basic schematic side view of an apparatus for fabricating thin films presented as one of the exemplary embodiments of the present invention.

Turning now to the drawings, the details of the present invention will be described with the help of its exemplary embodiments. FIG. 1 shows an apparatus 50 for fabricating dielectric thin films as one of the exemplary embodiments of the present invention is structured. The apparatus 50 uses a magnetron sputtering system is used for the deposition step in fabricating perovskite type oxide dielectric thin films. Inside a sputtering chamber 1, there are sputter targets 2,3,4 or targets serving as the cathode formed of a sintered oxide ferroelectric material. Preferably, each sputter target 2,3,4 is disposed on one circumference at positions symmetrical with one another to make it possible to perform a simultaneous sputtering deposition with up to three elements. A substrate 5 serving as the anode is disposed on a substrate holder 6 or passer in a radial direction so as to pass immediately over the targets 2, 3, and 4 when the substrate holder 6 is rotated. A lamp heating system or heater, such as by a light source 7, is used as the method for heating the substrate 5 to a specified or predetermined temperature as described below.

According to the foregoing embodiment, each respective target 2,3,4 is sputtered in a mixed atmosphere of argon (Ar) and oxygen ($O_2$) while the substrate holder 6 is rotated, resulting in a periodical change of the deposition speed of thin films according to the positional relations between the substrate 5 and sputter target(s) 2, 3, 4 under the condition of a specified substrate temperature. The time of the periodic change can be altered by the rotational speed of the substrate holder 6 and the number of the sputter targets 2, 3, 4 used. The maximum deposition speed of deposition of the thin films can be adjusted to the most suitable value by controlling the sputtering conditions such as sputtering electric power and the like.

As illustrated in FIG. 1, a slitting plate 8 has holes of suitable shapes to ensure a realization of the fundamental properties of thin films such as uniformity in composition, and the like. The substrate holder 6 is floated in terms of electric potential to suppress the impacts inflicted by electrons and ions from plasma.

Next, merely by way of illustration, the case where $Pb_{0.9}La_{0.1}Ti_{0.975}O_3$ thin films are formed will be explained as one of the exemplary embodiments of the present invention. A sintered ferroelectric material [$Pb_{0.9}La_{0.1}TiO_3$+ 0.2PbO] (6 inches in diameter) was used as the sputter targets 2,3,4, and the (100) plane of magnesium oxide (MgO) was used as the substrate 5 to form a thin film of 2 to 3 um thick. It was confirmed that the substrate temperature ranging from about 550° to about 650° C. is suitable to form a high crystallinity thin film of perovskite structure. It was also confirmed that $Ar/O_2$=about 20 to about 5 is suitable as the mixing ratio of Ar to $O_2$, and about 0.1 to about 0.5 Pa is suitable as the pressure. Also, a deposition speed of about 0.5 to about 2.5 Å/s was achieved with the target to substrate distance set at 80 to 90 mm and the input power set at 200 to 400 W per one target.

Crystal properties, morphology, and the like of thin films were changed according to the sputtering conditions, and also such electrical characteristics as dielectric constant, pyroelectric constant, or the like are changed. These changing aspects are dependent on material compositions and it is needed to optimize the material compositions on a case by case basis.

By setting forth the foregoing sputtering conditions, the deposition speed of the thin films located immediately above each respective target will be decided, but changes by time of the deposition speed and an average forming speed of the thin films will be dependent on the number of targets used and the rotational speed of the substrate holder 6.

First, a deposition speed and properties of the thin films formed were investigated with a substrate 5 disposed immediately above a sputter target 2, 3, 4 while the substrate holder 6 was being kept in a non-rotating state. In this case, the average forming speed was, as a matter of course, the same as the deposition speed. The deposition speed was controlled mainly by the input power to the sputter targets 2, 3, 4 and could be changed up to 2.5 Å/s at maximum, at which the sputter target 2, 3, 4 was kept intact and in a stabilized condition.

According to the analysis result of a plasma emission spectrochemical method, the metallic element composition ratio of the formed thin films was confirmed to be almost in agreement with the stoichiometrical ratio of Pb:La:Ti= 0.9:0.1:0.975 except for the composition ratio of Pb which deviates by about 10%.

Figure 2:
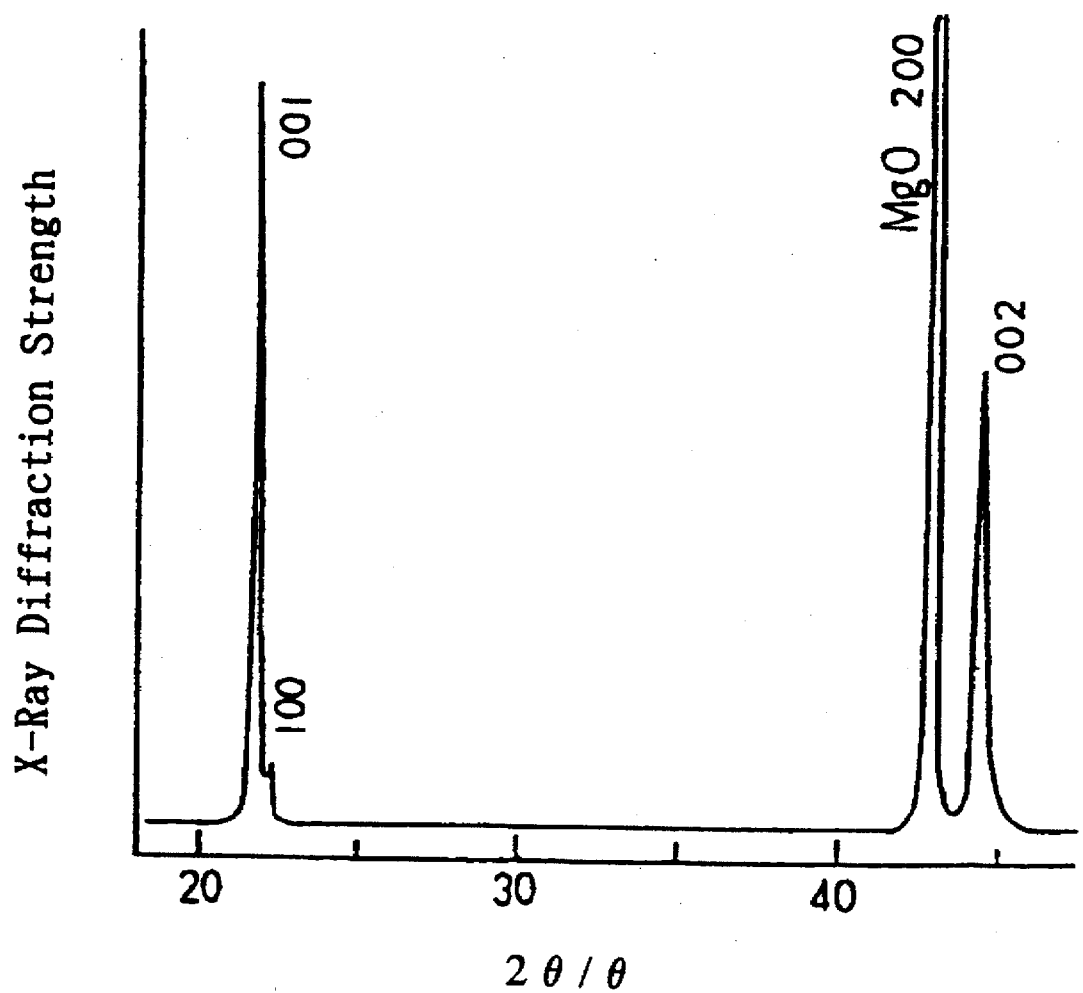
FIG. 2 shows an X-ray diffraction pattern to represent the crystalline properties of a dielectric thin film described is one of the exemplary embodiments of the present invention.

According to the analysis result of an X-ray diffraction method, the crystal properties of the thin films, as shown in FIG. 2, indicated an existence of the perovskite structure. Also, the lattice constants a=3.94 Å, b=4.09 Å as estimated from the diffraction Peaks (001), (100), (002) and (200) were confirmed to be in a good agreement with the values mentioned in literature. Also, the diffraction peaks (001) and (002) are remarkably strong and it is known that the orientation is strong in the direction of the c-axis serving as the polarization axis.

In electrical characteristics, the thin films having excellent crystallinity and a high c-axis orientation show a large pyroelectric constant $\gamma$ and an appropriately small dielectric constant $\epsilon$ which make it possible to anticipate a high sensitivity (proportionate to $\gamma/\epsilon$) when used in infrared sensors, and further, excellent characteristics when used in non-volatile memory devices.

There are a full width at half maximum (FWHM) of the diffraction peak (001) and a c-axis orientation ratio $\alpha$=I(001)/I[(001)+I(100)] as the indexes relative to the crystal properties that can be read from the X-ray diffraction data. (Note: I(001) and I(100) are the diffraction strength at the peaks (001) and (100), respectively.) When an evaluation was conducted with thin films prepared under a deposition speed ranging from 0.5 to 2.5 Å/s, FWHM=0.2° and $\alpha$=96 to 100% were obtained. As far as a judgment is made from these data, it is considered that thin films of excellent crystallinity were produced irrespective of the deposition speed.

Next, the thin films were isolated through etching the MgO substrate, disposed with electrodes on each respective surface of the front and back thereof, and the electrical properties across the film thickness, mainly pyroelectric characteristics, were evaluated. The results of the evaluation of the dielectric constant $\epsilon$ and pyroelectric constant $y$ showed that there was an upper limit in the deposition speed at which thin films with a sensor sensitivity as high as $\epsilon$=−170 and $\gamma$−5×$10^{-8}$ C/$cm^2$·K could be produced, and the limit was 1.8 Å/s. Notwithstanding the above favorable crystallinity patterns, the thin films formed at a deposition speed higher than 1.8 Å/s tended to show a low sensor sensitivity or $\epsilon$=−400 and $\gamma$−4×$10^{-8}$ C/$cm^2$·K at 2.5 Å/s. The foregoing is considered to be involving a problem attributable to morphology or stability of the growth condition of the crystal grains or the like. The upper limit in the deposition speed as observed above was varied according to the composition of the compounded thin films and the film formation condition thereof, and was confirmed by the inventors to fall within the range of 1.0 to 2.0 Å/s.

Figure 3:
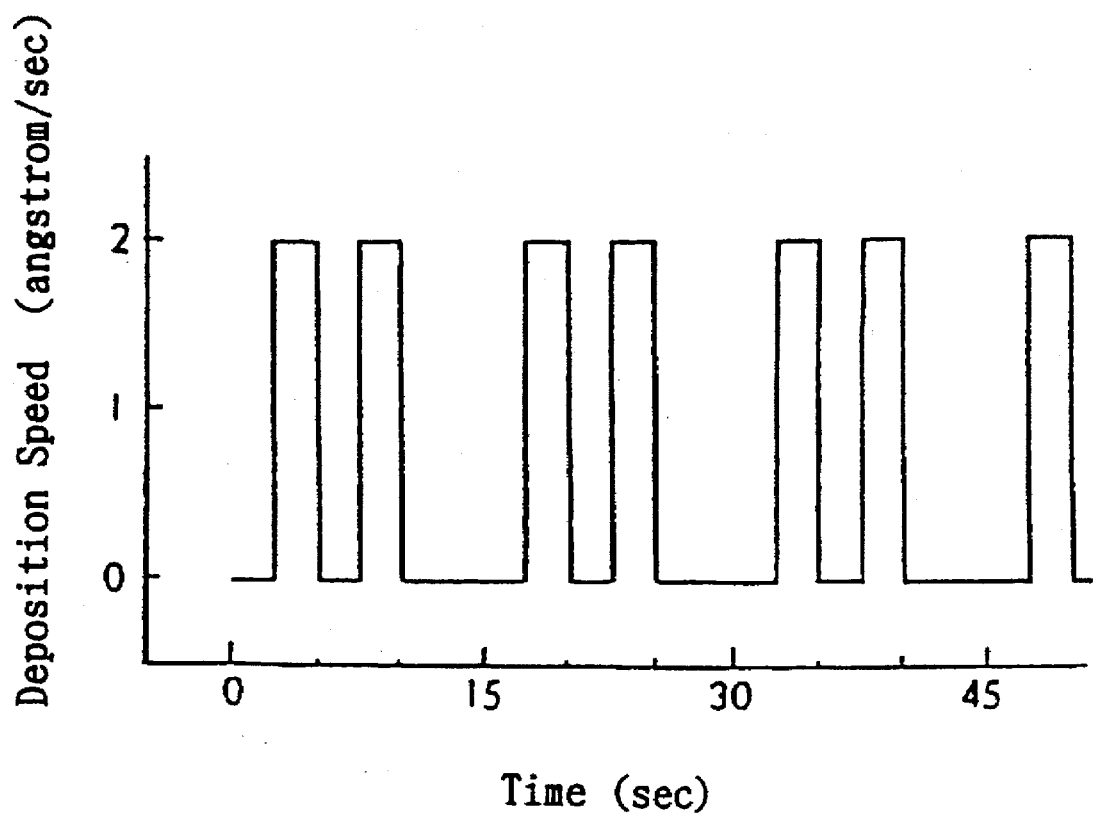
FIG. 3 is a diagram to show a performance of the deposition process of a dielectric thin film by deposition speed in angstrom/sec verses time in seconds presented as one of the exemplary embodiments of the present invention.

In order assure a sufficient growth and stabilization of crystal grains even under the condition of a high deposition speed, an intermittent and periodical introduction of a stabilizing process of non-deposition was added to the deposition process, wherein no thin films are deposited. When the number of sputter targets 2, 3, 4 is limited, such as using only sputter targets 2, 3 to be sputtered and the substrate holder 6 is rotated as illustrated in FIG. 1, a deposition process and a non-deposition process of nearly γ~0 Å/s deposition speed will be alternatingly taking place, as shown in FIG. 3. Accordingly, the average formation speed will be about ⅓ of the speed of the deposition taking place on the sputter targets 2, 3. While keeping the deposition speed on the targets at 2.5 Å/s, which earlier produced previously only a low sensor sensitivity with the substrate holder 6 kept in a non-rotating condition, the substrate holder was rotated at 4 rpm, and the effect of introducing a non-deposition process periodically was investigated. In this case, the formation time was extended three times before gaining the same film thickness.

The result of an X-ray diffraction measurement of the formed thin film showed good crystallinity of FWHM=0.2° and α=98%, and also pyroelectric characteristics of $\epsilon$ ~170 and γ~5×10$^{-8}$ C/cm$^2$·K, which made it possible to anticipate a sensor sensitivity equal to that of the case wherein the deposition speed was low (not higher than 1.8 Å/s in the present exemplary embodiment).

The foregoing result was considered due to an introduction of the processes to assure a sufficient growth and stabilization of crystal grains that have taken place by steps against the thin films deposited at a high speed, through periodically repeating the processes of [deposition]—[non-deposition (or stabilization)]—[deposition]—[non-deposition (or stabilization)] and repeated alternatively as required.

The thin films formed according to the present invention are sufficiently stabilized and considered to excel in long period stability and also in reliability. Besides, by having a plurality of substrates prepared and passed over the targets in succession and periodically, much higher through-put will be realized when compared with the case wherein a deposition process is repeated with one target, since the time required in installing the substrate, raising and lowering the temperature, or the like can be greatly reduced.

Even when one large target is used for deposition on all the substrates simultaneously, the places where the substrates are mounted and yet the uniformity in deposition is maintained will be rather scarce. In this respect, too, the method disclosed by the present invention is superior when it comes to mass-producibility.

Other variations of the first embodiment of the invention are possible. For example, in the foregoing exemplary embodiment, a non-deposition or "stabilization" process, wherein the deposition speed is 0 Å/s was referred to as a stabilizing process. However, in principle, as long as the stabilization process is a low speed deposition process (not higher than 1.8 Å/s in the foregoing exemplary embodiment), there will be no problem to deposit over the thin films formed during the period of high speed deposition while the thin films are being stabilized during the stabilization process. Thus, after the high speed deposition process, the stabilization process includes a period of low speed deposition whereby thin films formed during the period of high speed deposition are stabilized during the low speed deposition process.

In yet other variations, when the period for continuous formation at a high deposition speed is excessively long, the stabilizing process following thereafter may not sometimes be effective enough. Therefore, it will be further necessary to study or modify the periodic time of periodically changing the deposition speed and the proportion of the high speed deposition period.

Figure 4:
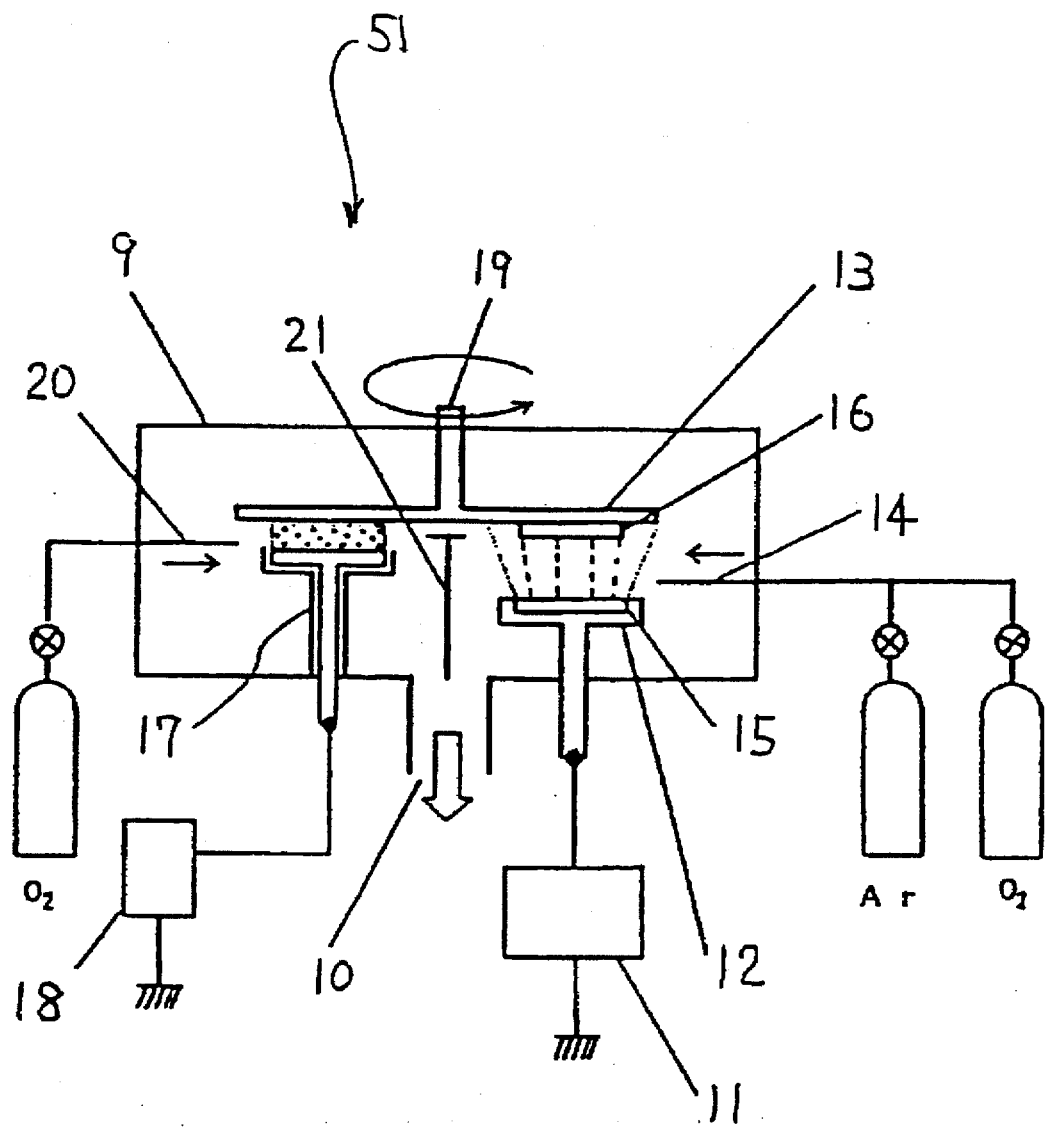
FIG. 4 is a basic schematic cross-sectional view of an apparatus for fabricating thin films presented as one of the exemplary embodiments of the present invention.
Figure 5:
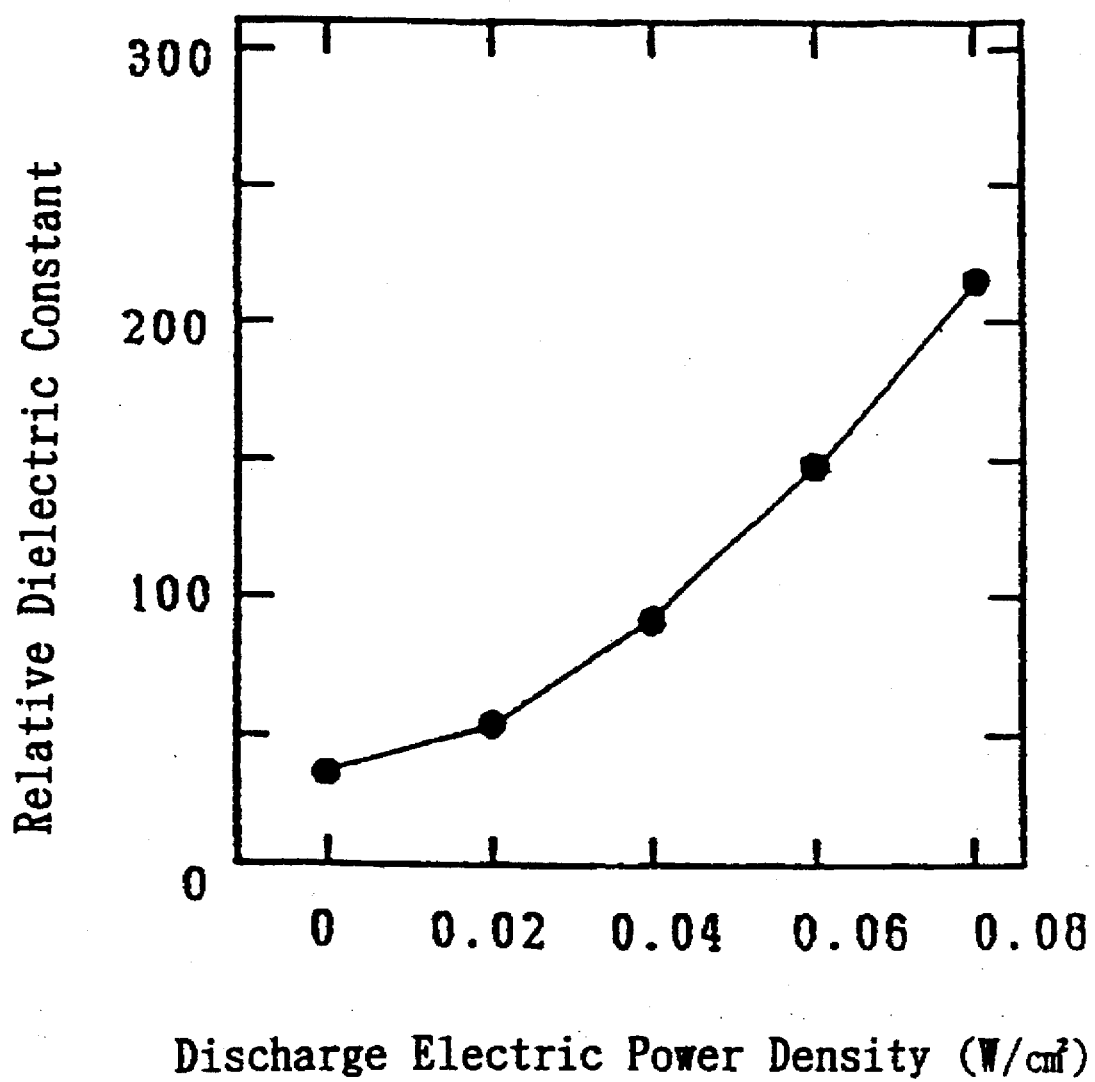
FIG. 5 is a graph to show the relative dielectric constants verses the discharge electric power density of a dielectric thin film presented as one of the exemplary embodiments of the present invention.
Figure 6:
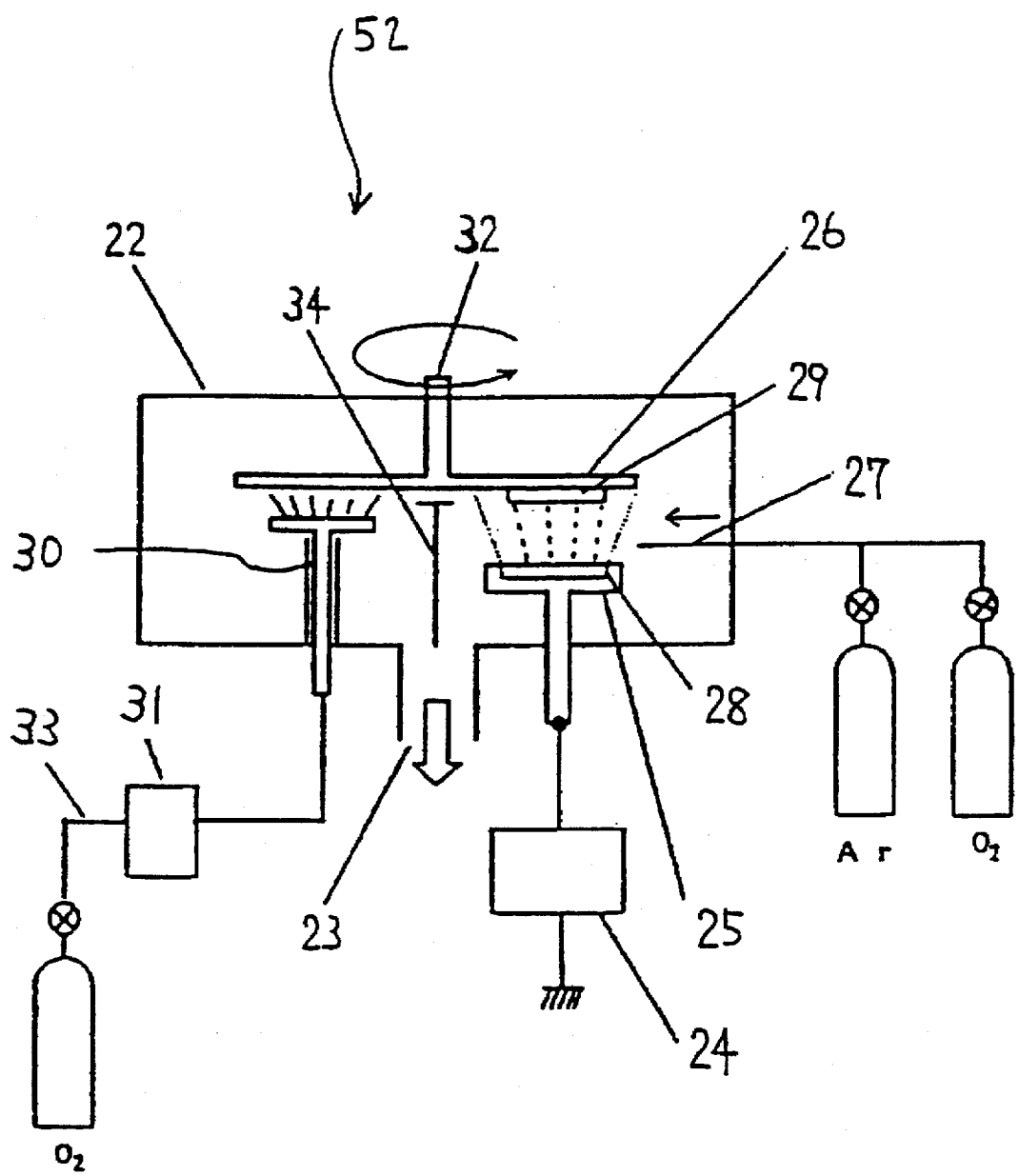
FIG. 6 is a basic schematic cross-sectional view of an apparatus for fabricating thin films Presented as one of the exemplary embodiments of the present invention.
Figure 7:
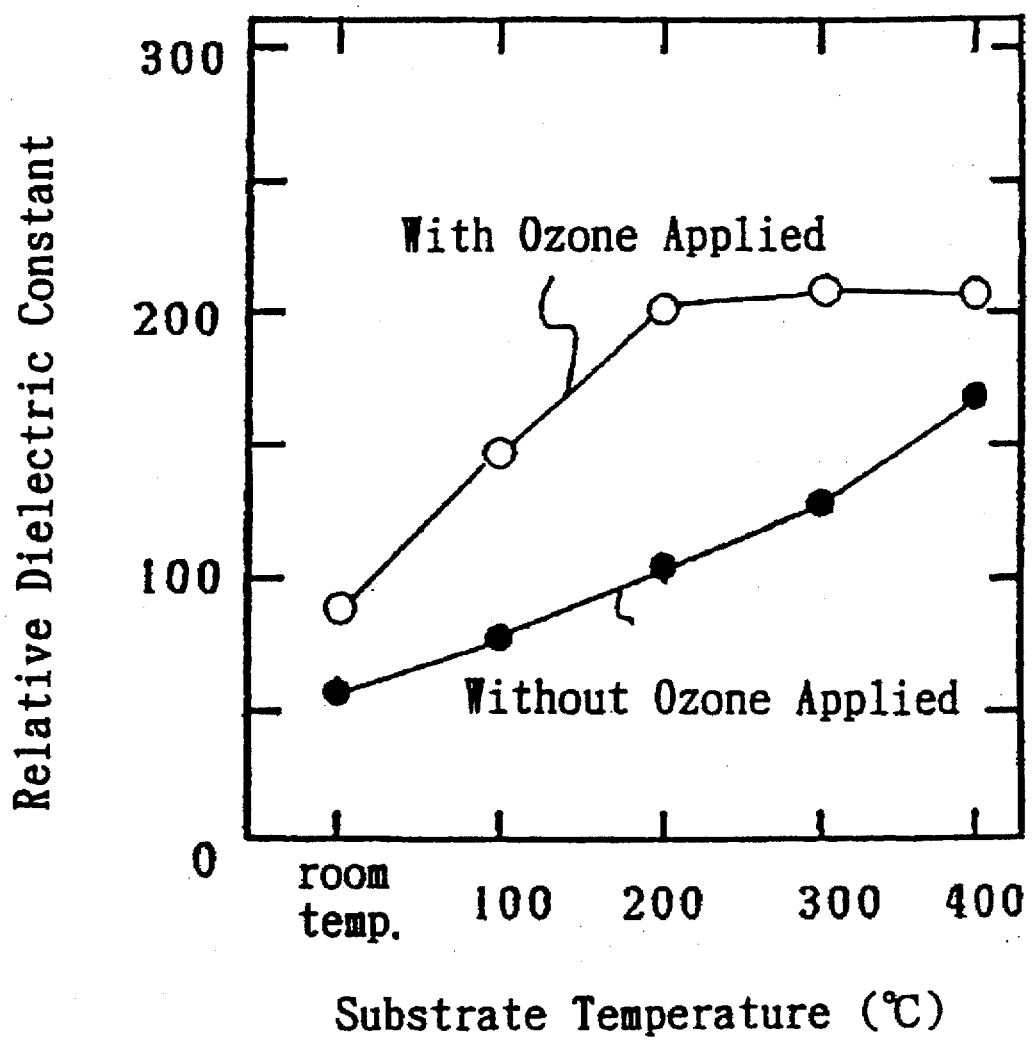
FIG. 7 is a graph to show the relative dielectric constants verses substrate temperature of a dielectric thin film presented as one of the exemplary embodiments of the present invention.
Figure 8:
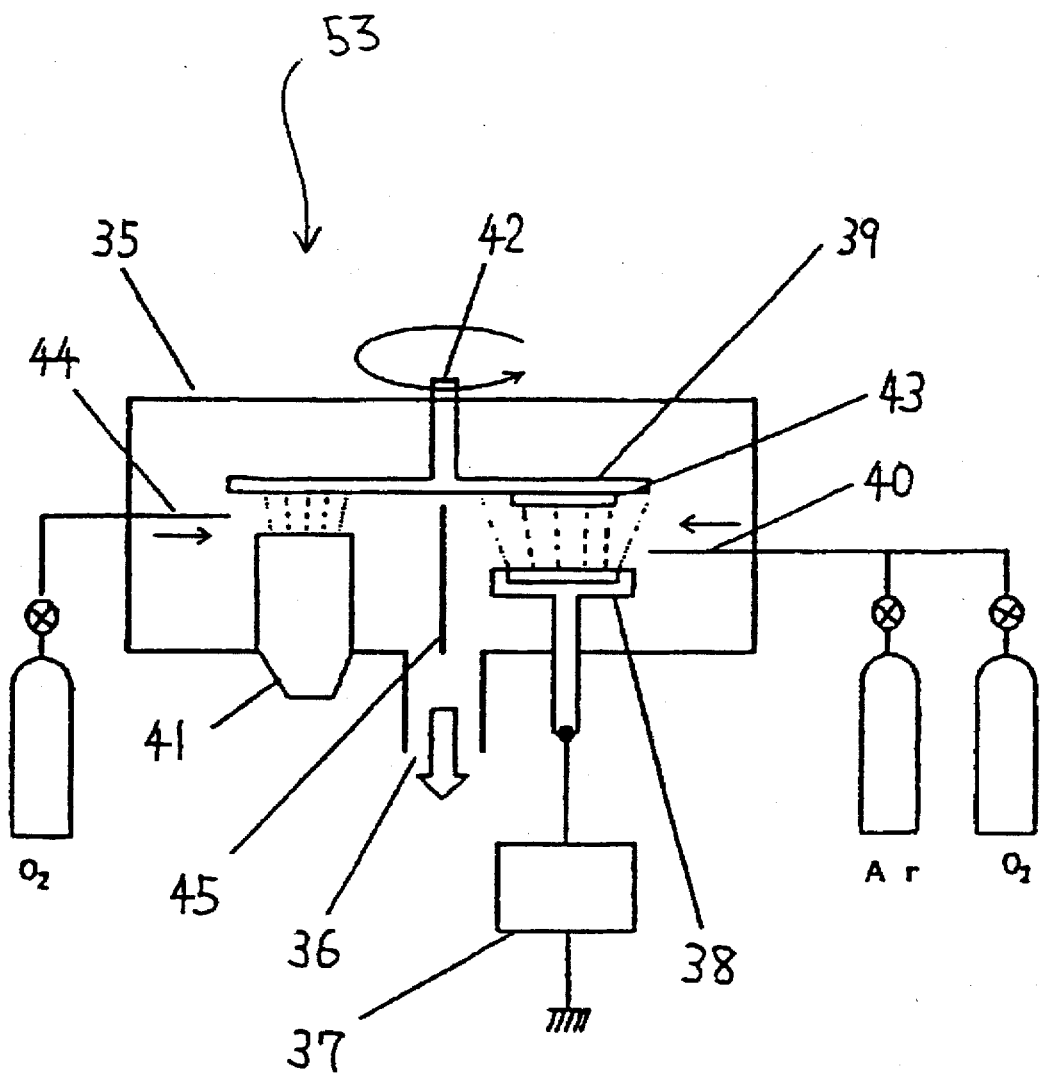
FIG. 8 is a basic schematic cross-sectional view of an apparatus for fabricating thin films presented as one of the exemplary embodiments of the present invention.
Figure 9:
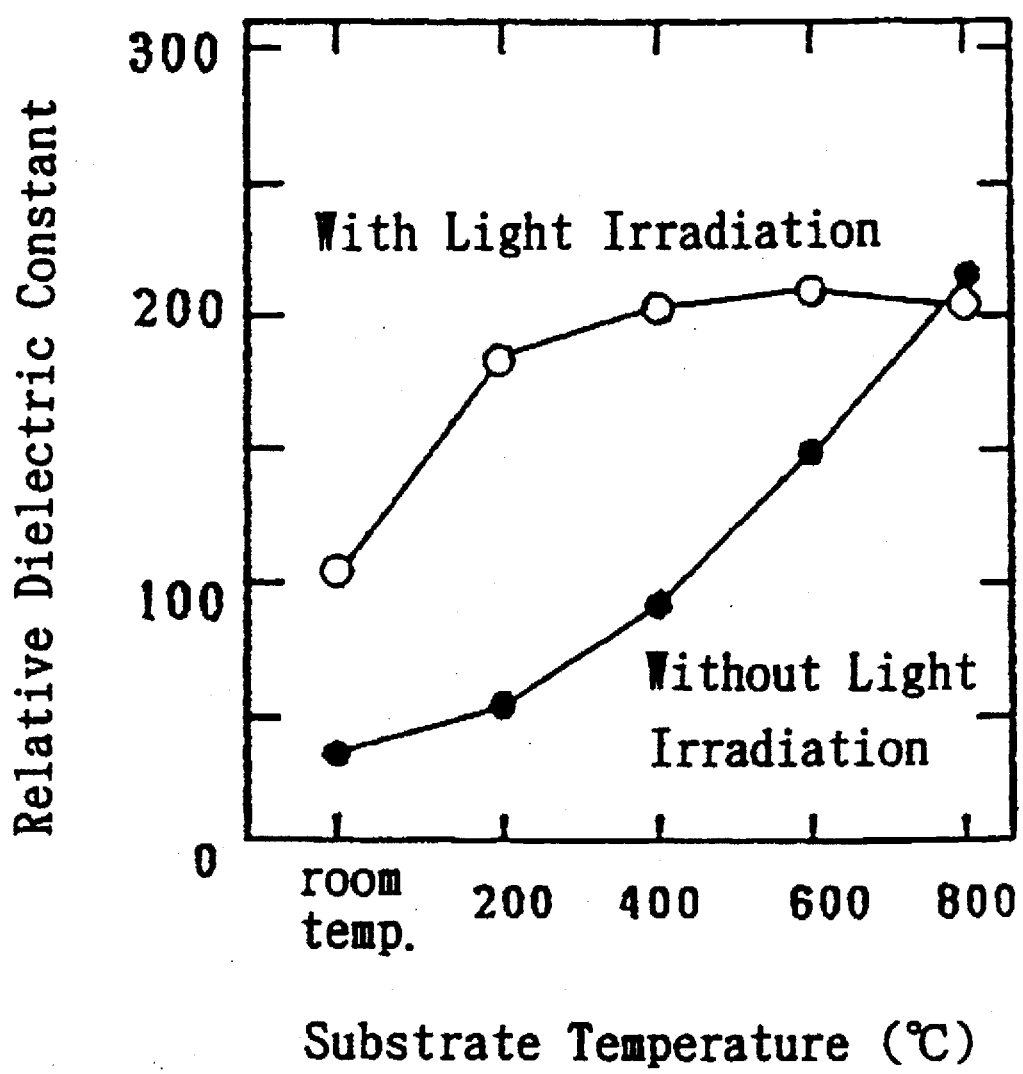
FIG. 9 is a graph to show the relative dielectric constants verses substrate temperature of a dielectric thin film presented as one of the exemplary embodiments of the present invention.

In yet further variations of the foregoing non-deposition or stabilization process, FIGS. 4–9 illustrate variations of processing methods of realizing thin films of good quality, which have a very small number of defects, by controlling the oxygen content in the thin films. Specifically, by way of illustration, in regard to suitable non-deposition processing methods:

(i) FIGS. 4 and 5 illustrate a decomposition excitation of a reactive gas due to plasma which takes place on or near the deposition surface in a gaseous atmosphere comprising a gas that reacts with the elements composing the thin films, (ii) FIGS. 6 and 7 illustrate where an oxidation reaction takes place on the deposition surface in a gaseous atmosphere comprising at least ozone ($O_3$), and (iii) FIGS. 8 and 9 illustrate where light of short wave length is irradiated on the deposition surface in a gaseous atmosphere comprising at least reactive elements.

One example of each variation of the stabilization or non-deposition process thereof will be described hereunder.

EXAMPLE I

Turning now to FIG. 4, a schematic illustration of a sputtering apparatus is illustrated whereby plasma processing of the devices to be used in the present invention can be performed. The apparatus 51 is basically the same as the apparatus 50 of FIG. 1, except for having replaced one of the targets with an electrode 17 for providing the substrate with excitation seeds-activation seeds by plasma discharge decomposition. A plasma processing power supply source 18 plasma excitator generates plasma by supplying an electric field. A second gas intake 20 is used for the purpose of generating a plasma. For example, in the case of forming an oxide thin film, a reactive gas for oxidation such as $O_2$ or the like only is introduced near the substrate. In the plasma processing step of non-deposition, numerous activated oxygen elements are generated due to plasma decomposition of gaseous oxygen molecules existing near the substrate and oxidize the defects where oxidation was insufficient or eliminate excessive oxygen from the thin film surface.

As a result, relatively fine and good quality thin films can be formed by deposition without hurting the substrate. With the apparatus used in the present example I, a partition 21 is disposed between the deposition area where targets are placed and the plasma processing area for non-deposition to provide a mixed gas atmosphere of Ar serving as the sputtering gas for the deposition process and an $O_2$ gas atmosphere, which is reactive, for the plasma processing step of non-deposition.

Next, specific aspects of example I will be explained. As show in FIG. 5, changes occur in the relative dielectric constant of lead titanate ($PbTiO_3$) thin films formed under the conditions wherein the substrate temperature was kept constant at 550° C., a high frequency power source (13.56 MHz) was used as the plasma processing power supply source, the electric power density thereof was changed from 0 to 0.1 W/cm$^2$, and the substrate holder was rotated at 3 rpm.

According to the present example I, one 6 inch target for deposition was used, the electrode for plasma disposition was 10 inches in diameter, the time required of the substrate to pass once over the target was about 5 seconds, and the plasma processing was applied for about 6 seconds after deposition of about 1.5 nm.

As clearly observed in FIG. 5, a distinctive improvement in the relative dielectric constant has been realized on account of the excitation reactive seeds provided by plasma. Even when the film deposition was performed under a low substrate temperature, an improvement in the dielectric characteristics was clearly observed.

EXAMPLE II

Turning to FIG. 6, a schematic illustration of a sputtering apparatus is illustrated whereby ozone processing of the devices to be used in the present invention can be performed. The apparatus 52 is basically the same as the apparatus 50 of FIG. 1, except for having replaced one of the targets with an ozone intake 30 for providing the substrate with active oxygen by ozone oxidation processing. Oxygen gas is fed to an ozone generating source 31 or ozone treater, and ozone is produced by a silent discharging method, for example, or the like.

According to the ozone processing step of non-deposition, numerous active oxygen atoms are generated near the substrate due to plasma decomposition of oxygen gas molecules or the like, for oxidation of the defects where oxidation has been insufficient and also for elimination of the excessive oxygen from the film surface. As a result, relatively fine and good quality thin films can be formed by deposition without hurting the substrate.

Next, specific aspects of example II will be presented. FIG. 7 shows changes in the relative dielectric constant of lead titanate ($PbTiO_3$) thin films formed by deposition as the substrate temperature was changed under one condition, wherein the substrate holder was rotated at 3 rpm, and ozone was introduced, and under another condition wherein the substrate holder was rotated at 3 rpm, and no ozone was introduced.

The introduced ozone had the form of a mixed gas of the 5 to 10% ozone produced by silent discharging of oxygen gas and the oxygen gas before reaction. According to the present example II, one 6 inch target for deposition was used, the electrode for plasma disposition was 10 inches in diameter, the time required of the substrate to pass once over the target was about 5 seconds, and the plasma processing was applied for about 6 seconds after deposition of about 1.5 nm. As clearly observed in FIG. 7, a distinctive improvement in the relative dielectric constant was realized on account of the process wherein oxidation and crystal growth were able to be promoted by introduction of ozone. Thus, even when the film deposition was performed under a low substrate temperature, an improvement in the dielectric characteristics was clearly observed.

EXAMPLE III

Turning now to FIG. 8, a schematic illustration of a sputtering apparatus is illustrated whereby light irradiation processing of the devices to be used in the present invention can be performed. In FIG. 8, the apparatus 53 is basically the same as the apparatus 50 of FIG. 1, except for having replaced one of the targets with a light source 41 or light irradiator for irradiating short wave length light on the substrate. According to the light irradiation step of non-deposition, numerous active oxygen atoms are generated by photolysis of oxygen gas molecules or the like existing near the substrate, which in turn provides the benefits of oxidation of the defects where oxidation was insufficient, elimination of the excessive oxygen from the film surface, and also thermally relieves the lattice strain produced in the thin films. As a result, relatively fine and good quality thin films can be formed by deposition without hurting the substrate.

Next, specific aspects of the example III will be illustrated. FIG. 9 shows changes in the relative dielectric constant of lead titanate ($PbTiO_3$) thin films formed by deposition as the substrate temperature was changed under the conditions wherein a low pressure mercury lamp was used as the light source with its irradiation amount kept at 0.5 W/cm$_2$ and the substrate holder was rotated at 3 rpm. According to the present example III, one 6 inch target for deposition was used, the electrode for plasma disposition as 10 inches in diameter, the time required of the substrate to pass once over the target was about 5 seconds, and the light was irradiated for about 6 seconds after deposition of about 1.5 nm. As clearly observed in FIG. 9, a distinctive improvement in the relative dielectric constant was realized on account of the process wherein oxidation and crystal growth were able to be promoted by light irradiation.

Thus, even when the film deposition was performed under a low substrate temperature, an improvement in the dielectric characteristics was clearly observed. As explained in the foregoing examples I–III, the present invention provides the advantages of providing an apparatus and produce suitable for providing thin films of good quality can be obtained by application of plasma processing, ozone processing or light irradiation in the non-deposition process.

In yet a further variation, the apparatus for fabrication of thin films as disclosed by the present invention can be effectively used in producing thin films of not only the perovskite type oxide dielectric substance but also multi-element oxides, which are similar to high temperature super conductive substances or the like.

In order to have these materials for thin films actually used, it is necessary to establish mass-producibility, stability, uniformity, and reproducibility thereof. In this regard, the present fabrication apparatus, whereby an excellent process to satisfy both the stability and mass-producibility is realized through having a plurality of substrates passed over a deposition source periodically and through the steps of [high speed deposition]—[stabilization]—[high speed deposition]—[stabilization] and repeated alternatingly as appropriate, is extremely effective.

Thus, according to the present invention, the embodiments of the present invention provide an apparatus and process for fabricating thin films of oxide dielectric substances which provides significant advantages over prior art processes and devices. The dielectric substances to be used are multi-element oxides, characteristics of which can be greatly influenced not only by the chemical composition and crystallinity but also by the morphology thereof were changed according to the sputtering conditions. Also, such electrical characteristics as dielectric constant, pyroelectric constant, or the like are changed to provide significant advantages. Moreover, the present invention has the advantages of providing very high precision thin films using these dielectric substances in mass production qualities.

Of course, it should be understood that a wide range of changes and modifications can be made to the preferred embodiments described above. It is therefore intended that the foregoing detailed description be regarded as illustrative rather that limiting, and that it is understood that it is the following claims, including all equivalents, which are intended to define the scope of this invention.

What is claimed is:

1. An apparatus for fabrication of dielectric thin films formed of $ABO_3$ perovskite type composite compounds, which are composed of the site A comprising at least one element from lead, barium, strontium and lanthanum, the site B comprising at least one element from titanium and zirconium, and oxygen, the apparatus comprising:

means for maintaining a substrate at a temperature at which perovskite type crystalline thin films are obtainable;

means for depositing thin films on a plurality of substrates using at least one multi-component material sputter target; and means for stabilizing the crystal grains of said thin films, wherein said depositing and said stabilizing functions are repetitively performed by periodically alternating the deposition of the thin films and stabilization of the thin films on said substrates.

2. The apparatus for fabrication of dielectric thin films according to claim 1, wherein the means for depositing thin films comprises a sputtering device, and further comprising:

means for passing each substrate over the targets periodically, and also means for controlling said means for depositing thin films on each said substrate, wherein said means for stabilizing the crystal grains of said thin films is repeated periodically.

3. The apparatus for fabrication of dielectric thin films according to claim 1 or claim 2, wherein said stabilizing means includes a means for providing each substrate with a plasma during non-deposition to react with raw material elements composing the thin films to stabilize the crystal grains of said thin films.

4. The apparatus for fabrication of dielectric thin films according to claim 1 or claim 2, wherein said stabilizing means includes a means for providing the deposited thin film surface with active oxygen during non-deposition to cause an oxidation reaction thereto in a gaseous atmosphere comprising at least ozone ($O_3$) to stabilize the crystal grains of said thin films.

5. The apparatus for fabrication of dielectric thin films according to claim 1 or claim 2, wherein said stabilizing means includes a means for irradiating short wave length light on the deposited thin film surface during non-deposition to stabilize the crystal grains of said thin films.

6. An apparatus for fabricating dielectric thin films formed of $ABO_3$ perovskite type composite compounds composed of a site A having at least one element selected from the group consisting of lead, barium, strontium and lanthanum, a site B having at least one element selected from the group consisting of titanium and zirconium, and oxygen, said apparatus comprising:

a heater suitable for maintaining a substrate at a temperature at which perovskite type crystalline thin films are obtained;

means for depositing thin films on a plurality of substrates using a plurality of multi-component material sputter targets of a same composition; and means for stabilizing the crystal grains of said thin films, wherein said depositing and said stabilizing functions are repetitively performed by periodically alternating the deposition of the thin films and stabilization of the thin films on said substrates.

7. The apparatus for fabricating dielectric thin films according to claim 6, wherein said stabilizing means stabilizes the crystal grains formed by said depositing means by depositing additional films at a deposition speed lower than the deposition speed of said depositing means.

8. The apparatus for fabricating dielectric thin films according to claim 6, wherein said depositing means comprises a sputterer, and further comprising:

a passer for passing each substrate over the targets periodically, wherein said depositing means is disposed to perform the thin film deposition on the substrates and said stabilizing means is disposed to perform the stabilization of the crystal grains in a sequential repetitive cycle.

9. The apparatus for fabricating dielectric thin films according to claim 6 or claim 8, wherein said stabilizing means includes a plasma excitator having a gas to cause an oxidation reaction during stabilization with raw material elements composing the thin films to stabilize the crystal grains of said thin films.

10. The apparatus for fabricating dielectric thin films according to claim 6 or claim 8, wherein said stabilizing means includes an ozone treater to apply active oxygen during stabilization to the deposited thin film surface and cause an oxidation reaction thereto in a gaseous atmosphere comprising at least ozone ($O_3$) to stabilize the crystal grains of said thin films.

11. The apparatus for fabricating dielectric thin films according to claim 6 or claim 8, wherein said stabilizing means includes a light irradiator for irradiating short wave length light on the deposited thin film surface during stabilization to stabilize the crystal grains of said thin films.

12. A sputtering apparatus for fabricating dielectric thin films formed on $ABO_3$ perovskite type composite compounds composed of a site A having at least one element selected from the group consisting of lead, barium, strontium and lanthanum, a site B having at least one element selected from the group consisting of titanium and zirconium, and oxygen, said apparatus comprising:

at least one ferroelectric material sputter target for depositing thin films on a substrate;

a rotative substrate holder on which a plurality of substrates are disposed;

a heater for maintaining a substrate temperature within a range from about 550° C. to about 650° C.; and a slitting plate having a hole therein, said slitting plate disposed between said sputter target and said rotative substrate holder for repetitively and periodically alternating the deposition of the thin films and stabilization of said thin films on said substrates to stabilize the crystal grains of said thin films.

* * * * *

UNITED STATES PATENT AND TRADEMARK OFFICE
CERTIFICATE OF CORRECTION

PATENT NO. :
DATED      :   5,674,366
INVENTOR(S) :  June 7, 1995
               Shigenori HAYASHI et al.

It is certified that error appears in the above-indentified patent and that said Letters Patent is hereby corrected as shown below:

Col. 11, line 28, delete "non-deposition" and insert --stabilizing--;

line 36, delete "non-deposition" and insert --stabilizing--; and line 44, delete "non-deposition" and insert --stabilizing--.

Col. 12, line 24, delete "stabilization" and insert --stabilizing--;

30, delete "stabilization" and insert --stabilizing--; and 39, delete "stabilization" and insert --stabilizing--.

Signed and Sealed this

Twenty-eighth Day of April, 1998

Attest:

BRUCE LEHMAN

Attesting Officer       Commissioner of Patents and Trademarks